(12) United States Patent
Huang et al.

(10) Patent No.: US 11,539,383 B2
(45) Date of Patent: Dec. 27, 2022

(54) BIDIRECTIONAL IMAGE-REJECTION ACTIVE ARRAY WITH REDUCED LO REQUIREMENT

(71) Applicant: SWIFTLINK TECHNOLOGIES CO., LTD., Suzhou (CN)

(72) Inventors: Min-Yu Huang, Atlanta, GA (US); Thomas Shoutao Chen, Vancouver (CA)

(73) Assignee: SWIFTLINK TECHNOLOGIES CO., LTD., Suzhou (CN)

( * ) Notice: Subject to any disclaimer, the term of this patent is extended or adjusted under 35 U.S.C. 154(b) by 0 days.

(21) Appl. No.: 17/102,042

(22) Filed: Nov. 23, 2020

(65) Prior Publication Data

US 2022/0166449 A1    May 26, 2022

(51) Int. Cl.
*H04B 1/00* (2006.01)
*H04B 7/0413* (2017.01)
*H04L 7/033* (2006.01)

(52) U.S. Cl.
CPC ......... *H04B 1/0085* (2013.01); *H04B 7/0413* (2013.01); *H04L 7/0331* (2013.01)

(58) Field of Classification Search
CPC .... H04B 1/0085; H04B 7/0413; H04L 7/0331
See application file for complete search history.

(56) References Cited

U.S. PATENT DOCUMENTS

| | | | | |
|---|---|---|---|---|
| 8,781,524 B2 * | 7/2014 | Watanabe | ............... | H04B 1/40 |
| | | | | 455/553.1 |
| 10,014,901 B1 * | 7/2018 | Wang | ...................... | H03F 3/195 |
| 2020/0186175 A1 * | 6/2020 | Ben-Yishay | ........... | H03B 19/14 |

FOREIGN PATENT DOCUMENTS

| | | | |
|---|---|---|---|
| CN | 103209154 A | | 7/2013 |
| CN | 107251505 A | | 10/2017 |
| CN | 110447146 A | | 11/2019 |
| WO | 2009036221 A1 | | 3/2009 |
| WO | 2015120585 A1 | | 8/2015 |

\* cited by examiner

*Primary Examiner* — Janice N Tieu
(74) *Attorney, Agent, or Firm* — Womble Bond Dickinson (US) LLP

(57) ABSTRACT

An RF frontend integrated circuit (IC) device comprises one or more RF transceivers to transmit and receive RF signals within a first frequency band and a second frequency band that is higher than the first frequency band. The RF frontend IC device further comprises a bidirectional LO signal generation circuit coupled to the one or more transceivers to generate a bidirectional LO signal. The bidirectional LO signal is injected between the first frequency band and the second frequency band. The bidirectional LO signal generation circuit is to perform a high-side LO injection for the RF signals within the first frequency band by injecting the bidirectional LO signal having an LO frequency higher than the first frequency band and to perform a low-side LO injection for the RF signals within the second frequency band by injecting the bidirectional LO signal having the LO frequency lower than the second frequency band.

18 Claims, 13 Drawing Sheets

BIDIRECTIONAL IMAGE-REJECTION ACTIVE ARRAY WITH REDUCED LO REQUIREMENT

FIELD OF THE DISCLOSURE

Embodiments of the present disclosure relate generally to wireless communication devices. More particularly, embodiments of the disclosure relate to a millimeter-wave (mm-Wave) communication system with bidirectional image rejection.

BACKGROUND

As wireless communications technologies evolve, multi-mode or multi-band wireless systems are routinely available. Such systems may partition different functions into different integrated circuit (IC) devices. For example, a wireless system may include a baseband processor, a transceiver, control circuitry, receive circuitry, transmit circuitry, or the like. Such multiple IC devices are sometimes inconvenient and cost ineffective.

Next-generation wireless networks require high-capacity access nodes for broadband mobile links over multiple non-contiguous mm-Wave bands. For instance, to support future multi-standard communication and international roaming, 5G new radio (NR) systems necessitate remote radio units and user equipment to operate with multiple mm-Wave bands (24/28/37/39/43.5 GHz). Moreover, massive multiple-input multiple-output (MIMO) and phased array architectures are extensively utilized to improve mm-Wave link performance and spatial diversity via beamforming and null-steering interference. Due to formfactor and cost requirements, to support future multi-band multi-standard communications, mm-Wave MIMO/phased arrays also demand wideband (>50% fractional bandwidth) frontends, posing challenges for multi-band transceiver frontend designs for 5G NR applications.

In order to generate such wideband local oscillator (LO) signals to provide image rejection, for example, from 24 GHz to 43.5 GHz, and the large fractional bandwidth (FBW) (57.8%), multiple wideband power-hungry LO generation sets with several phase locked loops (PLLs) are usually needed, causing a large chip area and a high power consumption.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Figure 1:
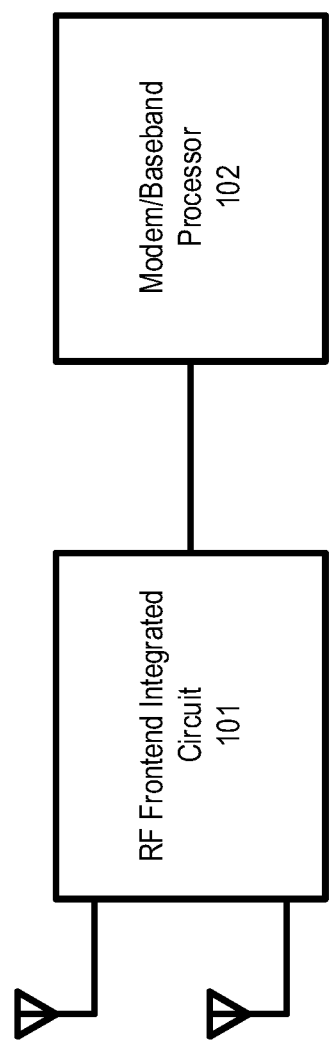
FIG. 1 is a block diagram illustrating an example of a wireless communication device according some embodiments of the disclosure.

Various embodiments and aspects of the disclosure will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment. The appearances of the phrase "some embodiments" in various places in the specification do not necessarily all refer to the same embodiments.

According to some embodiments, an LO signal is injected between a lower band (24-29.5 GHz) and an upper band (37-43.5 GHz) to create signal bidirectional selection architecture and reject lower sideband and upper sideband images of each other. This selection between bands may double an operation bandwidth and require a smaller LO tuning range. Furthermore, a generalized system architecture for E-band 5G communication (71-75 GHz and 82-86 GHz) is disclosed herein as the LO signal is operating in a middle band such as 76-81 GHz with 6-GHz intermedia frequency (IF) frequency. Since LO requirement is reduced into a narrower operation bandwidth, the LO signals generation may only necessitate one multiplier (tripler) utilized with a RF phased locked loop (PLL) circuit, thereby achieving less power consumption and better phase noise. Moreover, transceiver (TRX) architecture may be a 2×2 element array unit with PLL synchronization, which may be scaled to be N×N large-element active array and support dual polarization and bi-directional LO injection and image rejection. In this way, future 5G or even 6G-beyond MIMO/phased array communication may be enabled with a low mm-Wave LO signal generation requirement.

According to some embodiments, an RF frontend integrated circuit (IC) device comprises one or more RF transceivers to transmit and receive RF signals within a first frequency band and RF signals within a second frequency band that is higher than the first frequency band. The RF frontend IC device further comprises a bidirectional LO signal generation circuit coupled to the one or more transceivers to generate bidirectional LO signals. The bidirectional LO signal is injected between the first frequency band and the second frequency band. The bidirectional LO signal generation circuit is to perform a high-side LO injection for the RF signals within the first frequency band by injecting the bidirectional LO signal having an LO frequency higher than the first frequency band and to perform a low-side LO injection for the RF signals within the second frequency band by injecting the bidirectional LO signal having the LO frequency lower than the second frequency band.

According to some embodiments, a method for communication by an RF frontend IC device is disclosed. The method comprises transmitting and receiving RF signals within a first frequency band and RF signals within a second frequency band. The method further comprises injecting, by a bidirectional LO signal generation circuit, a bidirectional LO signal between the first frequency band and the second frequency band. The method comprises performing a high-side LO injection for the RF signals within the first frequency band by injecting the bidirectional LO signal having an LO frequency higher than the first frequency band and performing a low-side LO injection for signals within the second frequency band by injecting the bidirectional LO signal having the LO frequency lower than the second frequency band.

FIG. 1 is a block diagram 100 illustrating an example of a wireless communication device according some embodiments of the disclosure. Referring to FIG. 1, wireless communication device 100, also simply referred to as a wireless device, includes, among others, an RF frontend integrated circuit (IC) 101 and a modem/baseband processor 102. Wireless device 100 may be any kind of wireless communication devices such as, for example, mobile phones, laptops, tablets, network appliance devices (e.g., Internet of thing or IOT appliance devices), etc.

Figure 2:
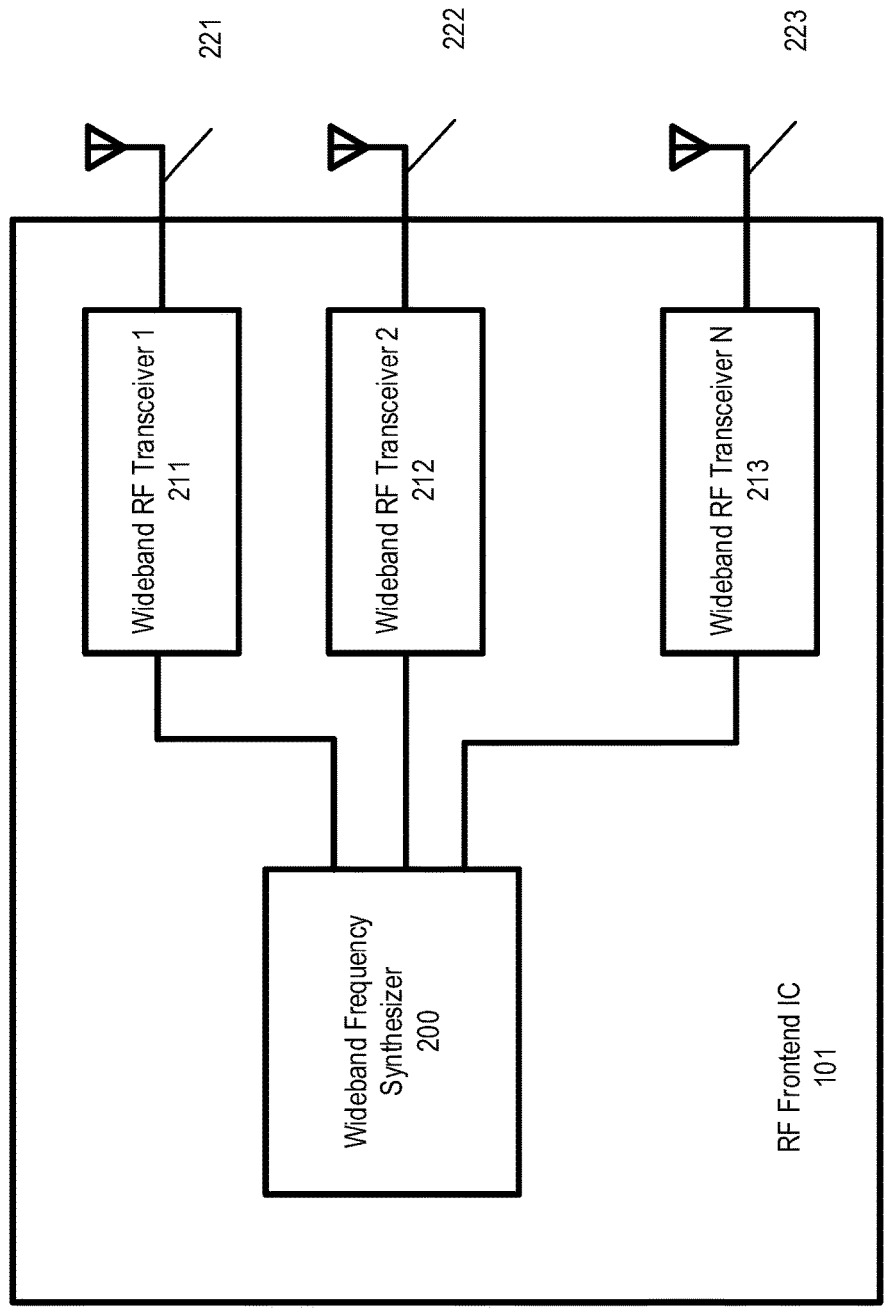
FIG. 2 is a block diagram illustrating an example of an RF (radio frequency) frontend integrated circuit according to some embodiments of the disclosure.

FIG. 2 is a block diagram 200 illustrating an example of an RF frontend IC according to some embodiments of the disclosure. Referring to FIG. 2, RF frontend IC 101 includes, among others, a full-band frequency synthesizer 200 coupled to an array of RF transceivers 211-213. Each of transceivers 211-213 is configured to transmit and receive RF signals within a particular frequency band or a particular range of RF frequencies via one of RF antennas 221-223. In one embodiment, each of transceivers 211-213 is configured to receive a LO signal from full-band frequency synthesizer 200. For example, the LO signal may be generated for the corresponding frequency band. The LO signal may be utilized to mix, modulate, demodulated by the transceiver for the purpose of transmitting and receiving RF signals within the corresponding frequency band.

Figure 3:
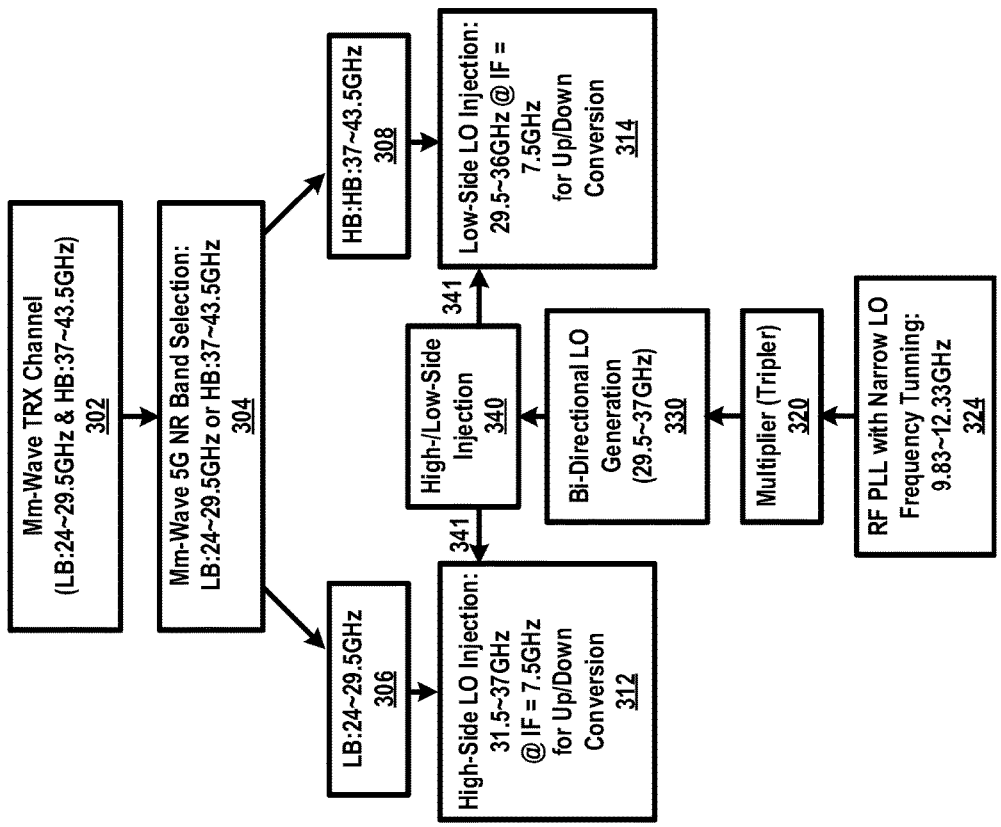
FIG. 3 is a flow diagram illustrating an example of mm-Wave bidirectional signal-selection/image-rejection transceiver frequency architecture according to some embodiments of the disclosure.

FIG. 3 is a flow diagram illustrating an example of mm-Wave bidirectional signal-selection/image-rejection transceiver frequency architecture according to some embodiments of the disclosure. In the illustrated example depicted by the flow chart, a first frequency band (e.g., low frequency band (LB)) RF signals 306 (mm-Wave) and a second frequency band (e.g., high frequency band (HB)) RF signals 308 (mm-Wave) are first detected by a (mm-wave) 5G NR band selection circuit (selector) 304 after the RF signals are received by an array of RF transceivers (TRXs) 302. Referring to FIG. 2 and FIG. 3, in one embodiment, a first RF TRX (e.g., 211), for example, may be configured to transmit and receive RF signals 306 within the first frequency band. A second RF TRX (e.g., 212) may be configured to transmit and receive RF signals 308 within the second frequency band that is higher than the first frequency band. The first frequency band may be in a range of 24.5-29.5 GHz, and the second frequency band 308 may be in a range of 37-43.5 GHz.

If the TRXs are just simply operated with a low-side only or high-side only LO injection for up/down conversion, an LO frequency requirement would be 17-36 GHz for a low-side LO injection and 32-51 GHz for a high-side LO injection respectively. The large frequency operation is extremely difficult for mm-Wave LO generation.

As illustrated in FIG. 3, the LB (24-29.5 GHz) mm-Wave signals 306 and HB (37-43.5 GHz) mm-Wave signals 308 are received by mm-Wave TRXs 302. Then, the LB (24-29.5 GHz) mm-Wave signals 306 and HB (37-43.5 GHz) mm-Wave signals 308 are sensed by mm-Wave 5G NR band selection circuit (selector) 304. A bidirectional local oscillator (LO) signal generation circuit (generator) 330 is configured to generate a bidirectional LO signal 341. The bidirectional LO signal 341 is injected between the first frequency band (LB) and the second frequency band (HB). The bidirectional LO signal generation circuit 330 is to perform a high-side LO injection for the RF signals 306 within the first frequency band (LB) by injecting the bidirectional LO signal 341 having an LO frequency higher than the first frequency band and to perform a low-side LO injection for the RF signals 308 within the second frequency band (HB) by injecting the bidirectional LO signal 341 having the LO frequency lower than the second frequency band. As an example, an intermediate frequency (IF) may be set at 7.5 GHz. The IF is a frequency to which a carrier wave is shifted as an intermediate step in transmission or reception. The IF is created by mixing the carrier signal with a local oscillator signal in a process called heterodyning, resulting in a signal at the difference or beat frequency.

On one hand, if the operation frequency is LB signal 306, the signal 306 is processed with the high-side LO injection 312 for up/down conversion. When the first frequency band (LB) RF signals 306 are detected, the first frequency band RF signals 306 are processed with the first LO signal 341 for an up-conversion or a down conversion. A high-side injection of an LO signal refers to injecting the LO signal having a frequency that is higher than a frequency band of corresponding RF signals to be processed. For example, the LO frequency for the high-side LO injection 312 may be LB RF (24-29.5 GHz)+IF (7.5 GHz), which is in a frequency range of 31.5-37 GHz.

On the other hand, if the operation frequency is HB signal 308, the signal 308 is then processed with a low-side LO injection 314 for up/down conversion. When the second frequency band (HB) RF signals 308 are detected, the second frequency band RF signals are processed with the second LO signal 342 for an up-conversion or a down conversion. A low-side injection of an LO signal refers to injecting the LO signal having a frequency that is lower than a frequency band of corresponding RF signals to be processed. For example, the LO frequency for the low-side LO injection 314 may be HB RF (37-43.5 GHz)–IF (7.5 GHz), which is in a frequency range of 29.5-36 GHz.

Therefore, compared to conventional TRX design, the overall LO requirement is largely reduced to LO signals within the frequency range of 29.5-37 GHz to cover both LB and HB RF frequency ranges as illustrated in FIG. 3. In order to avoid pulling/interference effect on transmitting/receiving signals, the sharable bidirectional LO signal may be generated from one multiplier 320 and a narrower-band RF PLL 324. For example, the bidirectional LO generation circuit 330 may generate the LO signal 341 with a sharable frequency range of 29.5-37 GHz. The bidirectional LO generation 330 may generate the bidirectional LO signal 341 for the high-side and/or low-side injection 340.

In order to further have a better phase noise for the LO generation, the multiplier 320 may be chosen to be a tripler such that the RF PLL only needs to operate at 9.83-12.3 GHz RF frequency with a reduced FBW from 57.8% to 22.3%, which significantly lower design challenges on the PLL design.

The bidirectional LO generation 330 may be coupled to a converter (not shown) to provide LO signals to the converter. The bidirectional LO generation 330 may include the PLL circuit 324 operating at a PLL operating frequency. As shown in FIG. 3, for example, the intermediate frequency (IF) may be set to a frequency value of approximately 7.5 GHz.

Figure 4:
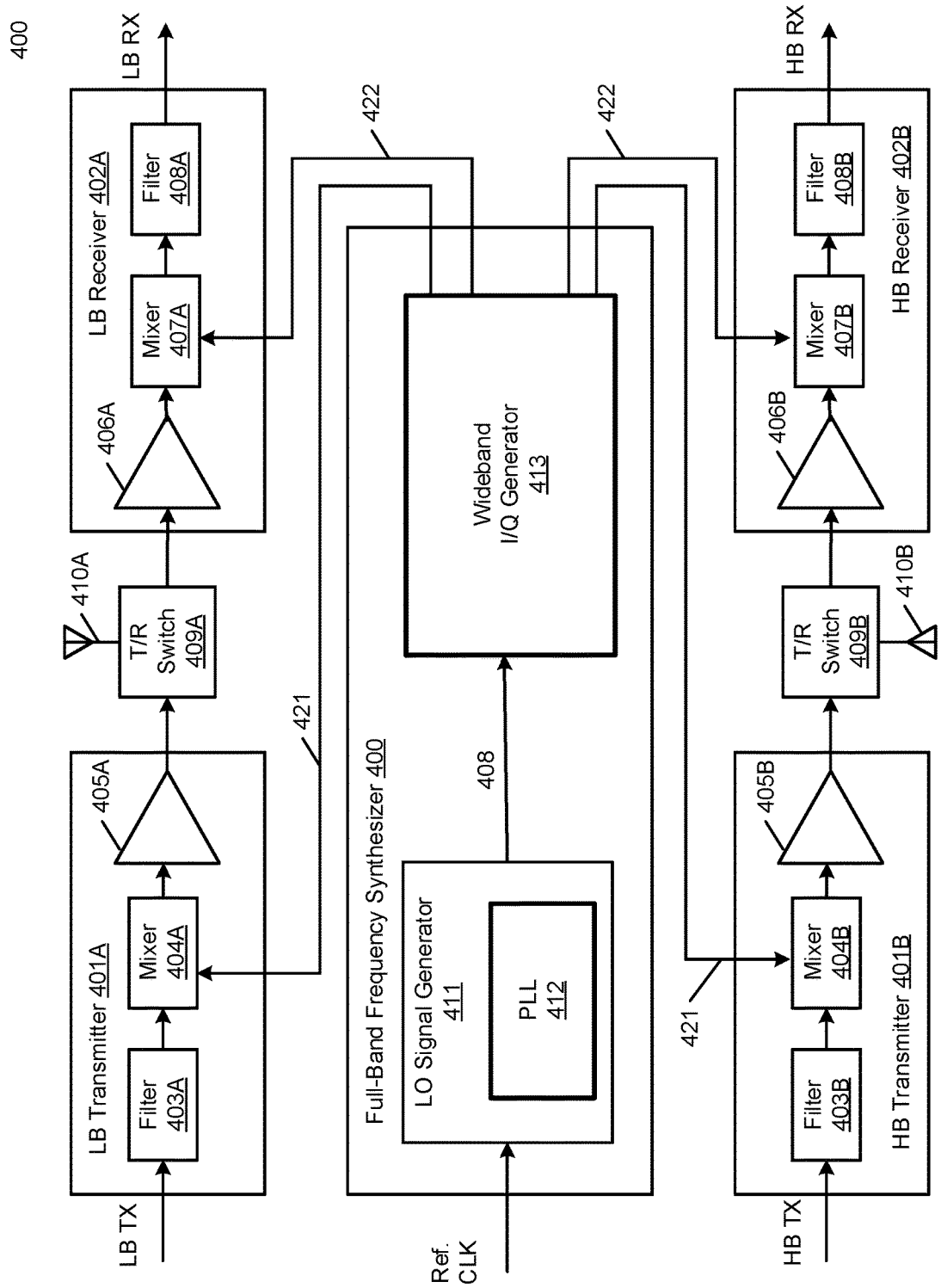
FIG. 4 is a block diagram illustrating an RF frontend integrated circuit according to some embodiments of the disclosure.

FIG. 4 is a block diagram 400 illustrating an RF frontend integrated circuit according to some embodiments of the disclosure. Referring to FIG. 4, full-band frequency synthesizer 400 may represent full-band frequency synthesizer 101 as described above. In one embodiment, full-band frequency synthesizer 400 is communicatively coupled to an array of transceivers, each transceiver corresponding to one of a number of frequency bands. In this example, full-band frequency synthesizer 400 is coupled to transmitter 401A, receiver 402A, transmitter 401B, and receiver 402B. Transmitter 401A and receiver 402A may be a part of a first transceiver operating in a lower frequency band, referred to as an LB transmitter and LB receiver. Transmitter 401B and receiver 402B may be a part of a second transceiver operating in a higher frequency band, referred to as a HB transmitter and HB receiver. Note that although there are only two transceivers as shown in FIG. 4, more transceivers may also be coupled to full-band frequency synthesizer 400 as shown in FIG. 2.

Again, in this example as shown in FIG. 4, there are two frequency bands covered by the frequency synthesizer 400. However, more frequency bands may be implemented within the integrated RF frontend. If there are more frequency bands to be implemented, more sets of frequency multipliers may be required.

In one embodiment, frequency synthesizer 400 includes, but is not limited to, LO signal generation circuit or block 411 and in-phase/quadrature (IQ) generator 413. The LO signal generation circuit or generator 411 may include a PLL 412, which is a control system that generates an output signal whose phase is related to the phase of an input signal. While there are several differing types, it is easy to initially visualize as an electronic circuit including a variable frequency oscillator and a phase detector. The oscillator generates a periodic signal, and the phase detector compares the phase of that signal with the phase of the input periodic signal, adjusting the oscillator to keep the phases matched. Bringing the output signal back toward the input signal for comparison is called a feedback loop since the output is "fed back" toward the input forming a loop. Keeping the input and output phase in lock step also implies keeping the input and output frequencies the same. Consequently, in addition to synchronizing signals, a phase-locked loop can track an input frequency, or it can generate a frequency that is a multiple of the input frequency. Phase-locked loops can be used to demodulate a signal, recover a signal from a noisy communication channel, generate a stable frequency at multiples of an input frequency (frequency synthesis), or distribute precisely timed clock pulses in digital logic circuits such as microprocessors.

Referring to FIG. 4, LO signal generator 411 is to receive a clock reference signal and to lock onto the frequency of the clock reference signal to generate the LO signal (e.g., 341). The LO signal may be optionally buffered by a LO buffer (not shown).

The RF frontend IC device also includes an in-phase/quadrature (I/Q) generator 413 to receive the LO signal 408 and to generate a 90-degree mm-Wave phase shift signal for a band-selective image signal rejection. Based on the LO signal 408, IQ generator 413 generates IQ signals that are suitable for mixing, modulating, and demodulating in-phase and quadrature components of RF signals. The IQ signals may be rotated by a predetermined angle or delayed by a phase rotator (not shown). The rotated IQ signals are then provided to the transmitters and receivers, e.g., LB transmitter 401A and receiver 402A. For example, the IQ signals may include transmitting IQ (TXIQ) signals 421 to be provided to LB transmitter 401A and in-phase and quadrature receiving IQ (RXIQ) signals 422 to be provided to LB receiver 402A. In some embodiments, phase shifting can be performed in LO path. For example, the IQ signals may include transmitting IQ (TXIQ) signals 421 to be provided to HB transmitter 401B and in-phase and quadrature receiving IQ (RXIQ) signals 422 to be provided to HB receiver 402B. The RF frontend IC device may additionally include an IF RC-CR poly-phase filter (PPF) (not shown) to reject an image signal of the RF signal.

LB transmitter 401A may include a filter 403A, a mixer 404A, and an amplifier 405A. Filter 403A may be a low-pass (LP) filter that receives LB transmitting (LBTX) signals to be transmitted to a destination, where the LBTX signals may be provided from a baseband processor such as baseband processor 102. Mixer 401A (also referred to as an up-convert mixer or an LB up-convert mixer)) is configured to mix and modulate the LBTX signals onto a carrier frequency signal based on TXIQ signal provided by LB phase rotators 414. The modulated signals (e.g., low-band RF or LBRF signals) are then amplified by amplifier 405A and the amplified signals are then transmitted to a remote receiver via antenna 410A.

LB receiver 402A may include an amplifier 406A, mixer 407A, and filter 408A. Amplifier 406A is to receive LBRF signals from a remote transmitter via antenna 410A and to amplify the received RF signals. The amplified RF signals are then demodulated by mixer 407A (also referred to as a down-convert mixer or an LB down-convert mixer) based on RXIQ signal received from LB phase rotators 414. The demodulated signals are then processed by filter 408A, which may be a low-pass filter. In one embodiment, LB transmitter 401A and LB receiver 402A share antenna 410A via a transmitting and receiving (T/R) switch 409A. T/R switch 409A is configured to switch between LB transmitter 401A and receiver 402A to couple antenna 410A to either LB transmitter 401A or LB receiver 402A at a particular point in time.

Similarly, HB transmitter 401B includes filter 403B, mixer 404B (also referred to as a HB up-convert mixer), and amplifier 405B having functionalities similar to filter 403A, mixer 404A, and amplifier 405A of LB transmitter 401A, respectively, for processing high-band transmitting (HBTX) signals. HB receiver 402B includes filter 406B, mixer 407B (also referred to as a HB down-convert mixer), and filter 408B having functionalities similar to amplifier 406A, mixer 407A, and filter 408A of LB receiver 402A, respectively, for processing high-band receiving (HBRX) signals. HB transmitter 401B and HB receiver 402B are coupled to antenna 410B via T/R switch 409B similar to the configuration of LB transmitter 401A and receiver 402A.

Figure 5:
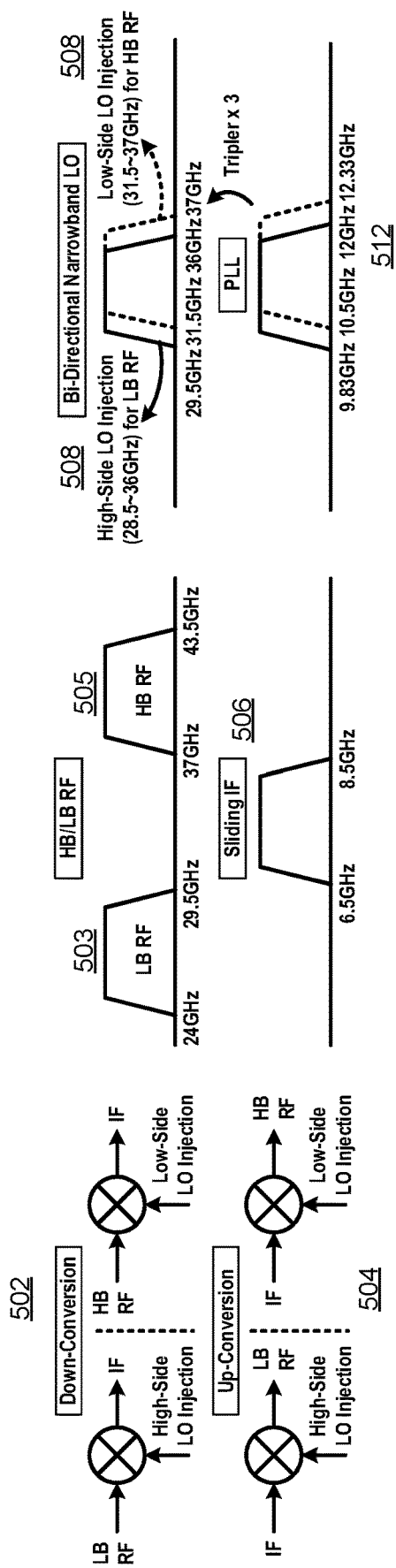
FIG. 5 is a block diagram illustrating frequency planning for bidirectional LO injection for up/down-conversion on HB/LB mm-Wave signal according to some embodiments of the disclosure.

FIG. 5 is a block diagram 500 illustrating frequency planning for bidirectional LO injection for up/down-conversion on HB/LB mm-Wave signal according to some embodiments. As discussed above, as an example, the LB high-side/HB low-side LO injection generation may be 31.5-37 GHz and 29.5-37 GHz respectively. Therefore, the PLL frequency 512 may be set as 9.83-12.3 GHz, for example. In one embodiment, the bidirectional LO generator (e.g., 411) may include a multiplier (e.g., tripler) to triple the frequency of the PLL operating frequency 512 (e.g., approximately ranging 9.83-12.3 GHz).

The bidirectional LO signal generator (e.g., 411) may generate the bidirectional LO signal, which is injected between the first frequency band (LB) and the second frequency band (HB). The bidirectional LO signal 508 has a frequency band higher than the first frequency band (LB) and lower than the second frequency band (HB). The bidirectional LO signal generator (e.g., 411) is to perform the high-side LO injection for the RF signals 503 within the first frequency band (LB) by injecting the bidirectional LO signal 508 having an LO frequency higher than the first frequency band (LB) and to perform a low-side LO injection for the RF signals 505 within the second frequency band (HB) by injecting the bidirectional LO signal 508 having the LO frequency lower than the second frequency band (HB).

Referring to FIG. 5, a frequency converter including a down-converter 502 to perform down conversion and an up-converter 504 to perform up-conversion. In one embodiment, the intermediate frequency (IF) 506 may be set to a frequency value of 7.5 GHz.

Because there is only one sharable PLL and only one multiplier for each LB and HB bidirectional LO generation, a large chip area may be saved and a power consumption may be reduced. Further, pulling/interference signal effect may be avoided, since the PLL operates at a much lower RF frequency compared to the conventional TRX design.

However, due to bidirectional signal selection, image rejection need to be handled carefully since the image signals also bi-directionally exist based on the high-side/low-side LO injection. A correct polarity may be selected for the image signals suppression.

Figure 6:
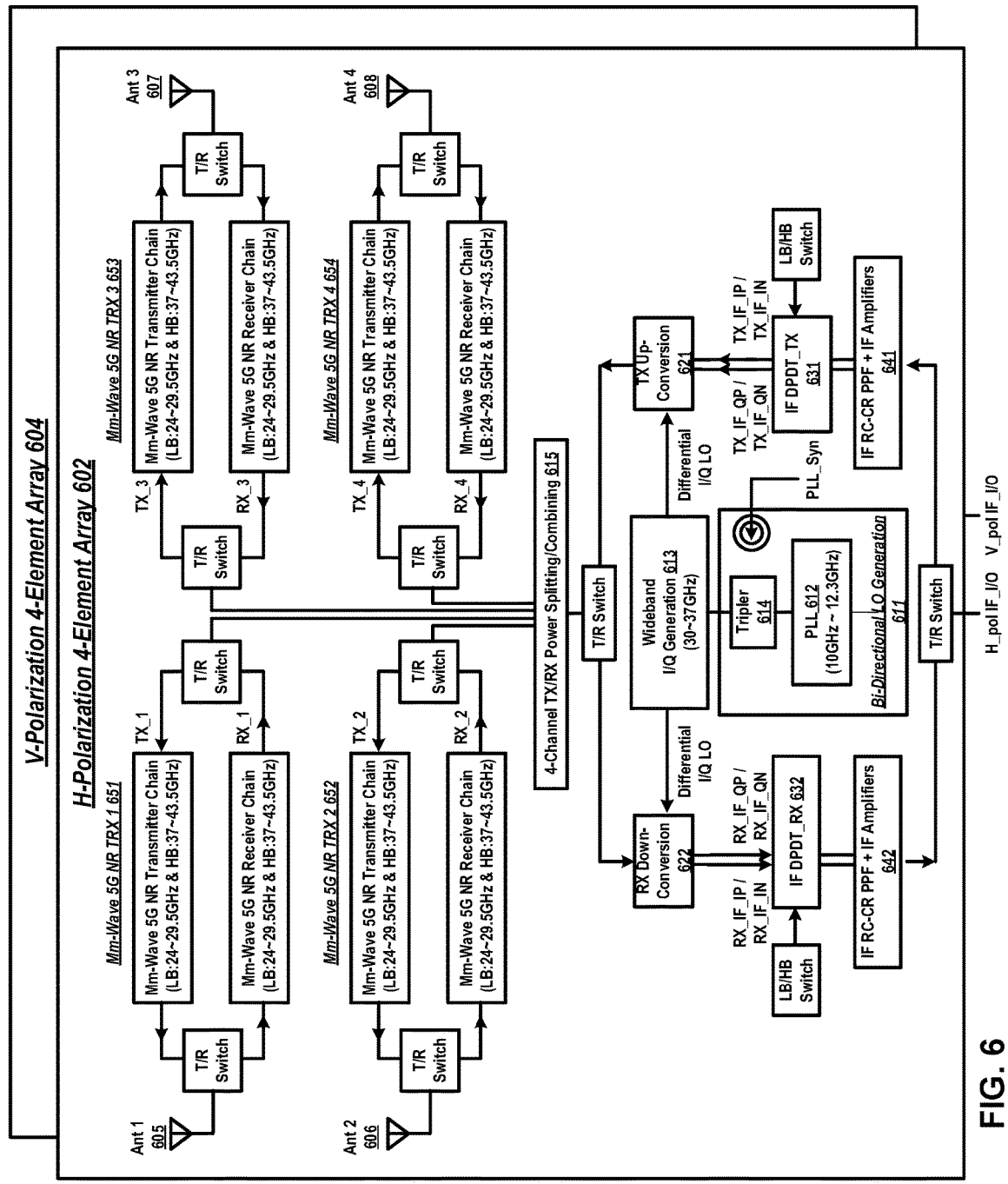
FIG. 6 is a block diagram illustrating a dual-polarization bidirectional LO-injection high-fractional bandwidth mm-Wave TRX array unit according to some embodiments of the disclosure.

FIG. 6 is a block diagram 600 illustrating a dual-polarization bidirectional LO-injection high-fractional bandwidth mm-Wave TRX array unit according to some embodiments of the disclosure. Referring to FIG. 6, for example, RF frontend IC device 600 includes a first polarization (e.g., a horizontal polarization) circuitry 602 (denoted by "H-polarization 4-Element Array") and a second polarization (e.g., a vertical polarization) circuitry 604 (denoted by "V-polarization 4-Element Array"). Each polarization (horizontal or vertical polarization) of the RF frontend IC device 600 includes 4-element scalable TRX units, which include 2×2 antenna array (e.g., Ant1 605, Ant2 606, Ant3 607, Ant 4 608), mm-Wave 5G TRX array (mm-Wave 5G TRX 1651, TRX2 652, TRX 3 653, TRX 4 654), 4-channel TX/RX power splitting/combing circuit 615, TX up-conversion circuit 621/RX down-conversion circuit 622, wideband I/Q LO generation circuit 613, IF Double Pole Double Throw (DPDT) switch 631 in TX and IF DPDT switch 632 in RX, and IF RC-CR poly-phase filters (PPFs) 641, 642 for bidirectional signal selection and image rejection. The bidirectional LO generation circuit 611 includes a tripler 614 and a narrower band RF PLL 612 to save power consumption and improve phase noise.

Each of the mm-wave 5G TRXs (e.g., 652, 652, 653, 654) is configured to transmit/receive RF signals for a single-channel. The single-channel can be a single frequency channel. RC-CR poly-phase filters (PPF) can be configured to split the IF signal into the I and Q paths at the desired frequency. Note that although there are only four transceivers as shown in FIG. 6, more transceivers may also be included.

In one embodiment, the TX/RX power splitting/combing circuit 615 is coupled between the TRXs (e.g., 652, 652, 653, 654) and the LO signal generator 611. The power splitting/combing circuit 615 is configured to combine RF signals received from the TRXs (e.g., 652, 652, 653, 654). The power splitting/combing circuit 615 is also configured to divide the RF signal into a number of RF sub-signals, where each of the number of RF sub-signals is provided to one of the TRXs (e.g., 652, 652, 653, 654) to be transmitted.

In one embodiment, the wideband I/Q LO generation circuit 613 is coupled to the bidirectional LO signal generation circuit 611. The wideband I/Q generator 613 generates differential I/Q LO for the TX up-conversion 621 and the RX down-conversion 622. The TX up-conversion circuit 621 is coupled to the wideband I/Q LO generation circuit 613, and the RX down-conversion circuit 622 is coupled to the wideband I/Q LO generation circuit 613.

In one embodiment, the IF DPDT circuit or switch 631 in TX is coupled with the TX up-conversion circuit 621, and the IF DPDT circuit or switch 632 in RX is coupled with the RX down-conversion circuit 622.

Figure 7:
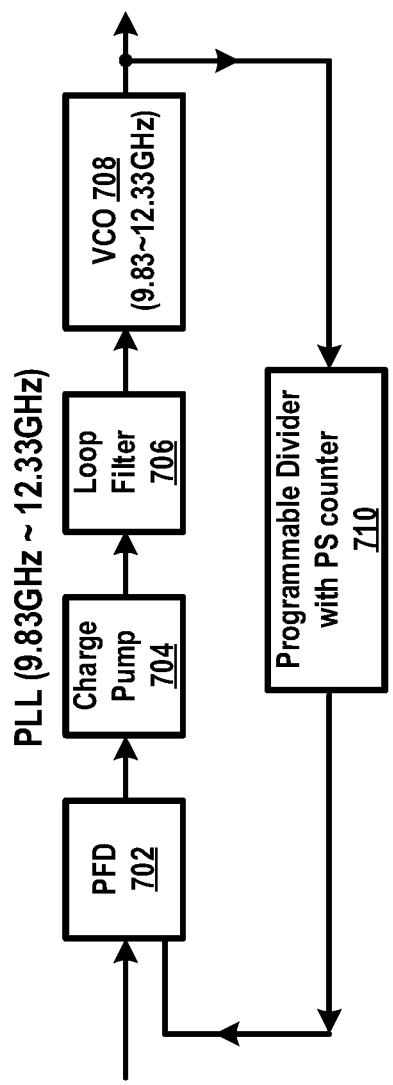
FIG. 7 is a block diagram illustrating an example of an RF PLL according to some embodiments of the disclosure.

FIG. 7 is a block diagram illustrating an example of an RF PLL 700 according to some embodiments of the disclosure. Referring to FIG. 7, the RF PLL circuit 700 may represent PLL block (e.g., 412, 612) as described above. In one embodiment, for example. the RF PLL circuit 700 includes a phase frequency detector (PFD) 702, a charge pump 704 coupled to the PFD 702, a loop filter 706 coupled to the charge pump 704, a voltage-controlled oscillator (VCO) 708 coupled to the loop filter 706 for providing the PLL operating frequency, and a programmable divider with a phase shift (PS) counter 710 to generate precise and finite cursor on frequency scaling. In one embodiment, VCO 708 can generate a PLL operating frequency (e.g., approximately ranging 9.83~12.33 GHz). A charge pump 704 can be a DC to DC converter that uses capacitors as charge storage to raise or lower an output voltage. The charge pump 704 can raise or lower a voltage to control the frequency of oscillation of the VCO 708.

Figures 8A, 8B:
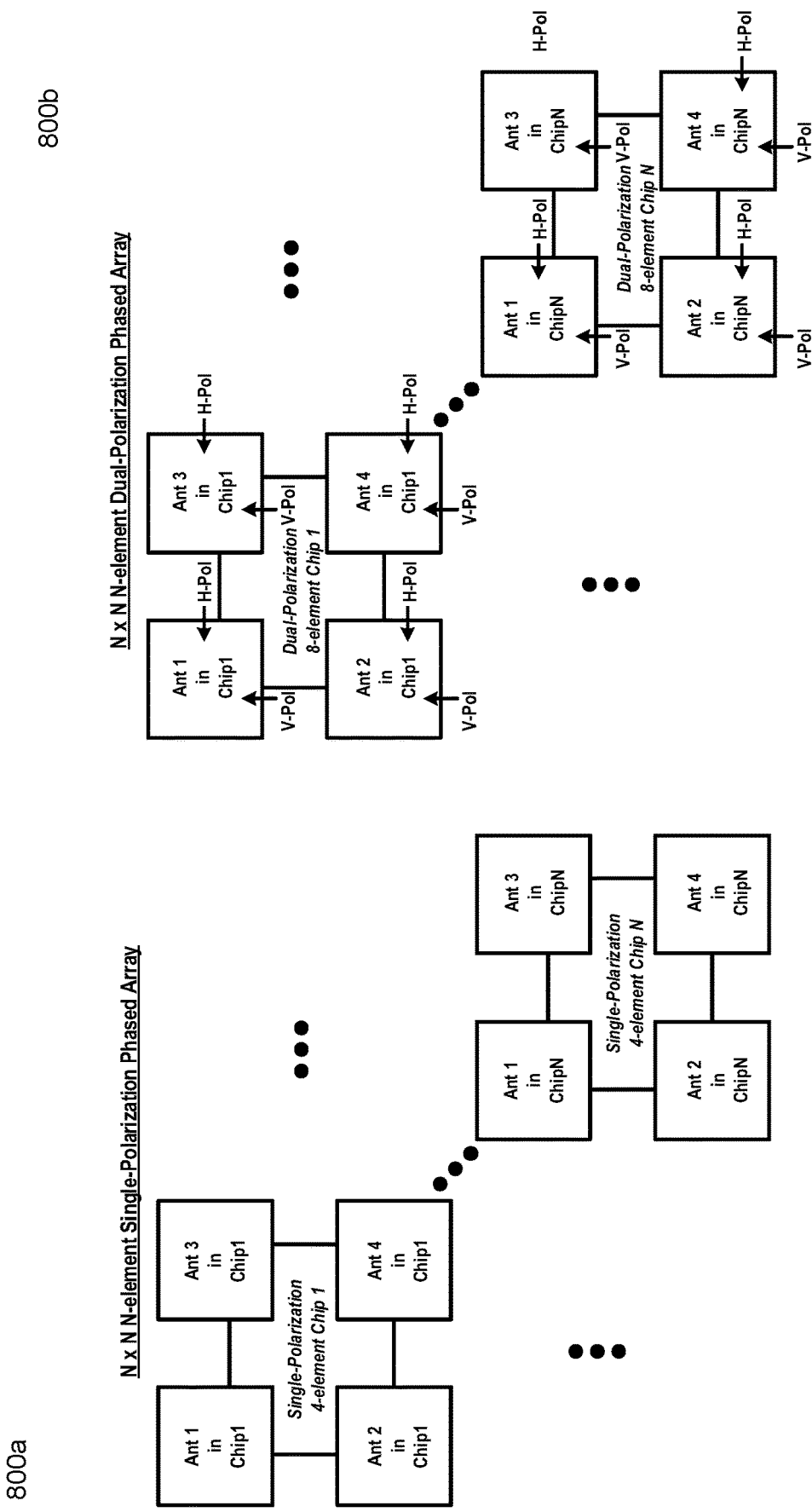
FIG. 8A is a block diagram 800a illustrating an example of a single-polarization N-element TRX array according to some embodiments of the disclosure.
FIG. 8B is a block diagram 800b illustrating an example of a dual-polarization N-element TRX array according to some embodiments of the disclosure

FIG. 8A is a block diagram 800*a* illustrating an example of a single-polarization N-element TRX array according to some embodiments of the disclosure. FIG. 8B is a block diagram 800*b* illustrating an example of a dual-polarization N-element TRX array according to some embodiments of the disclosure. The 4-element TRX array discussed above may be integrated into a N×N large-element array as shown in FIG. 8A and/or FIG. 8B. If the phased array requires dual-polarization, it can be easily scaled to support H- and V-polarization via using two 4-element TRX array chips in one system as an 8-element dual-polarization TRX unit for N×N dual-polarization large-element array (FIG. 8B).

Figure 9:
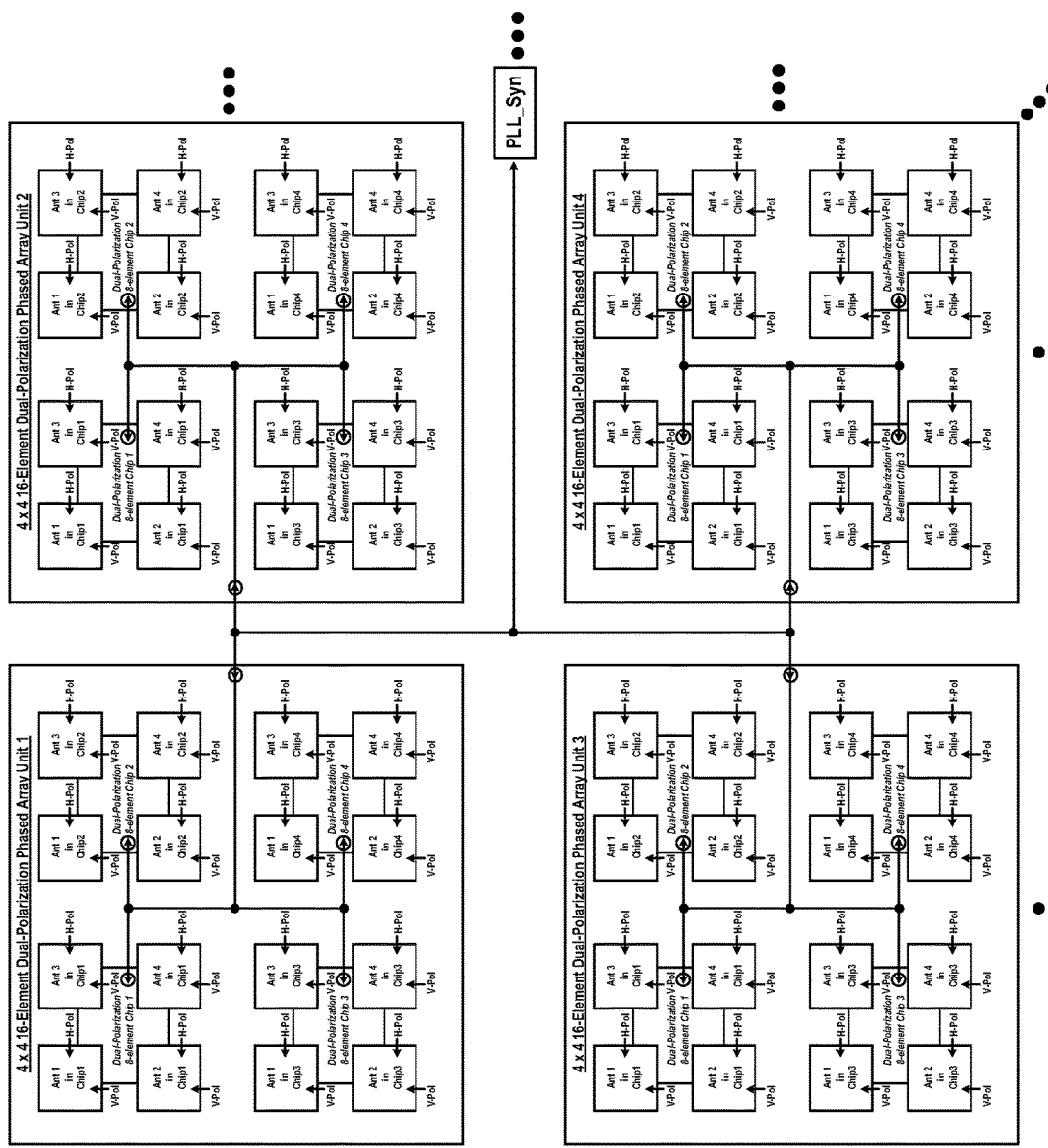
FIG. 9 is a block diagram illustrating an example of a dual-polarization N-element TRX array with centralized PLL synchronization according to some embodiments of the disclosure.

FIG. 9 is a block diagram illustrating an example of a dual-polarization N-element TRX array with centralized PLL synchronization according to some embodiments of the disclosure. To further synchronize the PLL signal timing, each 4-element TRX unit has PLL synchronization signal feeding (PLL_Syn) to control the LO timing, ensuring no extra phase delays within adjacent channels and degradation on array beamforming.

Figure 10:
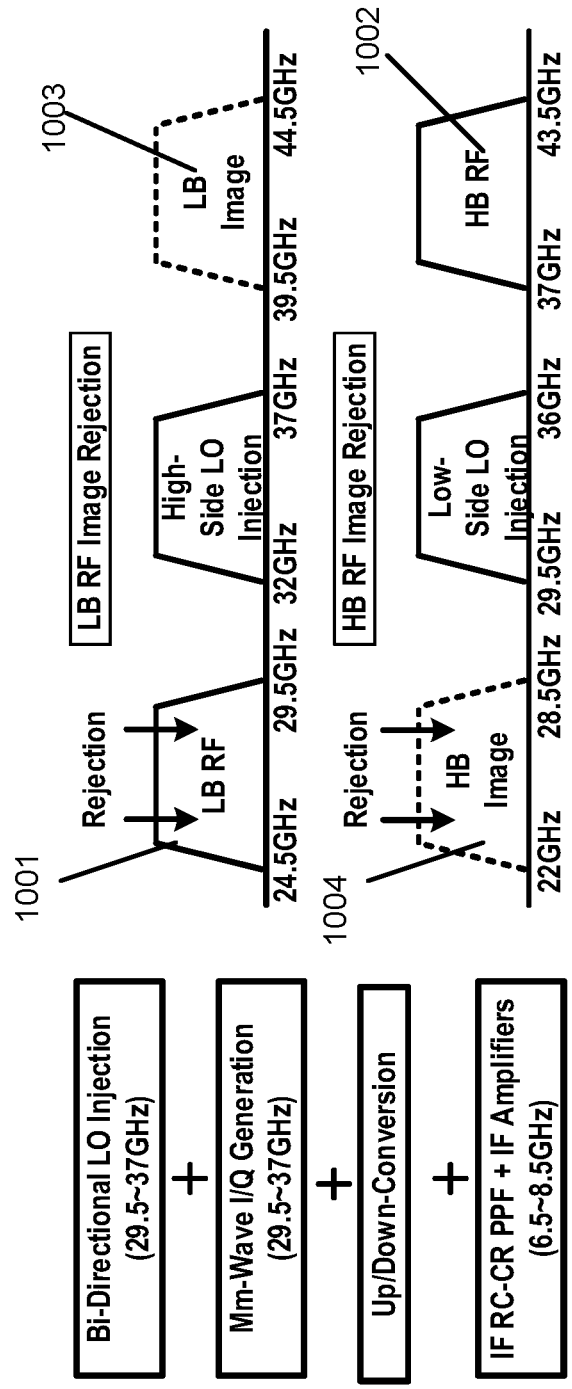
FIG. 10 is a block diagram illustrating an example of an incorrect image rejection during bidirectional LO operation according to some embodiments of the disclosure.

FIG. 10 is a block diagram illustrating an example of an incorrect image rejection during bidirectional LO operation according to some embodiments of the disclosure. Since the LO signal is selected by low-side or high-side injection based on the HB/LB RF signal, the corresponding image signal would be bidirectional compared to the LO signal. For example, if the incoming signal is LB signal 1001 with high-side LO injection, the image signal 1003 of the LB RF signal would be higher than the LO signal, which locates at 39.5-44.5 GHz, as illustrated in FIG. 10. On the other hand, if the incoming signal is HB signal 1002 with low-side LO injection, the image signal 1004 of the HB RF signal would be lower than the LO signal, which locates at 22-28.5 GHz, as illustrated in FIG. 10. If the LO I/Q and IF I/Q signal generation are only utilized to support one polarity on differential I/Q signal selection, the desired signal may be rejected as the LO operates in bidirectional feeding. For example, if the low-side LO injection is operated for the HB signal 1002, the differential I/Q sequence would be I+, I−, Q+, Q− to cancel the HB image signal 1004 which is at the lower frequency compared to LO signal. However, if the I/Q signal polarity didn't swap and keep as the sequence I+, I−, Q+, Q−, when the LO signal is bidirectional injected for the high-side injection, the LB signal 1001 which is at the lower frequency compared to the LO signal may be wrongly rejected.

Figure 11:
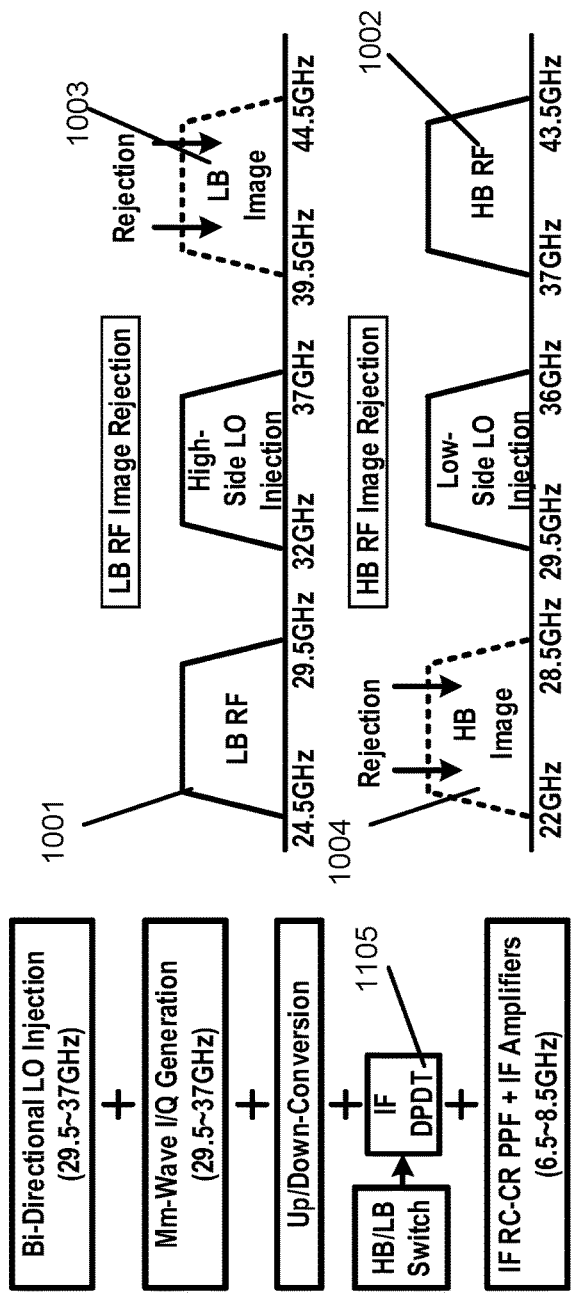
FIG. 11 is a block diagram illustrating an example of high frequency band (HB)/low frequency band (LB) image rejection frequency planning with IF DPDT according to some embodiments of the disclosure.

FIG. 11 is a block diagram illustrating an example of HB/LB image rejection frequency planning with IF DPDT according to some embodiments of the disclosure. The RF frontend IC device (e.g., 600) may further comprise at least one IF Double Pole Double Throw (DPDT) circuit (e.g., 631, 632) coupled with the TX up-conversion circuit (e.g., 621) or the RX down-conversion circuit (e.g., 622), wherein the DPDT circuit 1105 (e.g., 631, 632) is configured for correct image rejection. To complete the image rejection at different frequencies for both the LB image signal 1003 and the HB image signal 1004, the DPDT circuit 1105 (e.g., 631, 632), which is a bidirectional I/Q swap circuit, changes the I/Q polarity such that the image signals 1003, 1004 may be selected and rejected during the bidirectional LO operation, as illustrated in FIG. 11. The DPDT 1105 may operate at an IF frequency instead of mm-Wave LO frequency to achieve power-efficient signal swapping.

Figure 12:
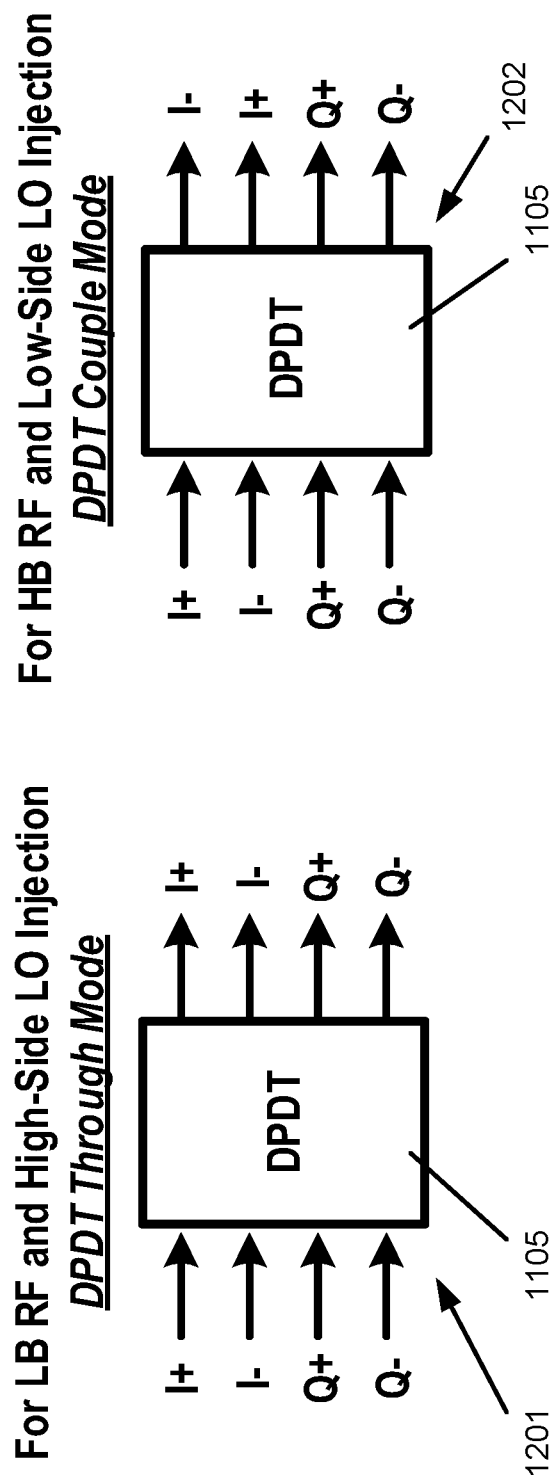
FIG. 12 is a block diagram illustrating an example of a DPDT for I/Q polarity swapping during bidirectional LO injection for correct image selection and rejection according to some embodiments of the disclosure.

FIG. 12 is a block diagram 1200 illustrating an example of a DPDT for I/Q polarity swapping during bidirectional LO injection for correct image selection and rejection according to some embodiments of the disclosure. The DPDT circuit 1105 (e.g., 631, 632) may have a through mode 1201 and a couple mode 1202. The DPDT circuit 1105 (e.g., 631, 632) may keep an I/Q polarity of signals in the through mode 1201, and change the I/Q polarity of signals in the couple mode 1202.

Referring to FIG. 12, in the DPDT Through Mode 1201, the signal sequence I+, I−, Q+, Q− keeps the same after going through the DPDT 1105. If the DPDT 1105 changes to the Couple Mode 1202, the polarity sequence is changed to I−, I+, Q+, Q− after going through the DPDT 1105 to achieve bidirectional image signal selection and rejection.

Referring to FIG. 11 and FIG. 12, the DPDT 1105 may controlled by the LB/HB switch 1106 to select correct differential I/Q polarity accordingly. The overall signal flow is as follow. In response to the LB RF signal 1001 injection to the TRX, the band selector (e.g., 304) would select the high-side LO injection and IF DPDT in the Couple Mode 1202 to cancel the LB image signal 1003. Similarly, if the injection signal to the TRX is HB RF signal 1002, the band selector would swap to low-side LO injection and IF DPDT in Through Mode 1201 to cancel HB image signal 1004 correspondingly. In this way, a smart frequency selection for the desired signal is enabled, which achieves LO signal requirement reduction and image selection/rejection simultaneously. A high-fractional-bandwidth, power-efficient, size-reduction large-element active array may be created, and multi-band bidirectional image rejection for mm-Wave 5G dual-polarization operations may be achieved.

Figure 13:
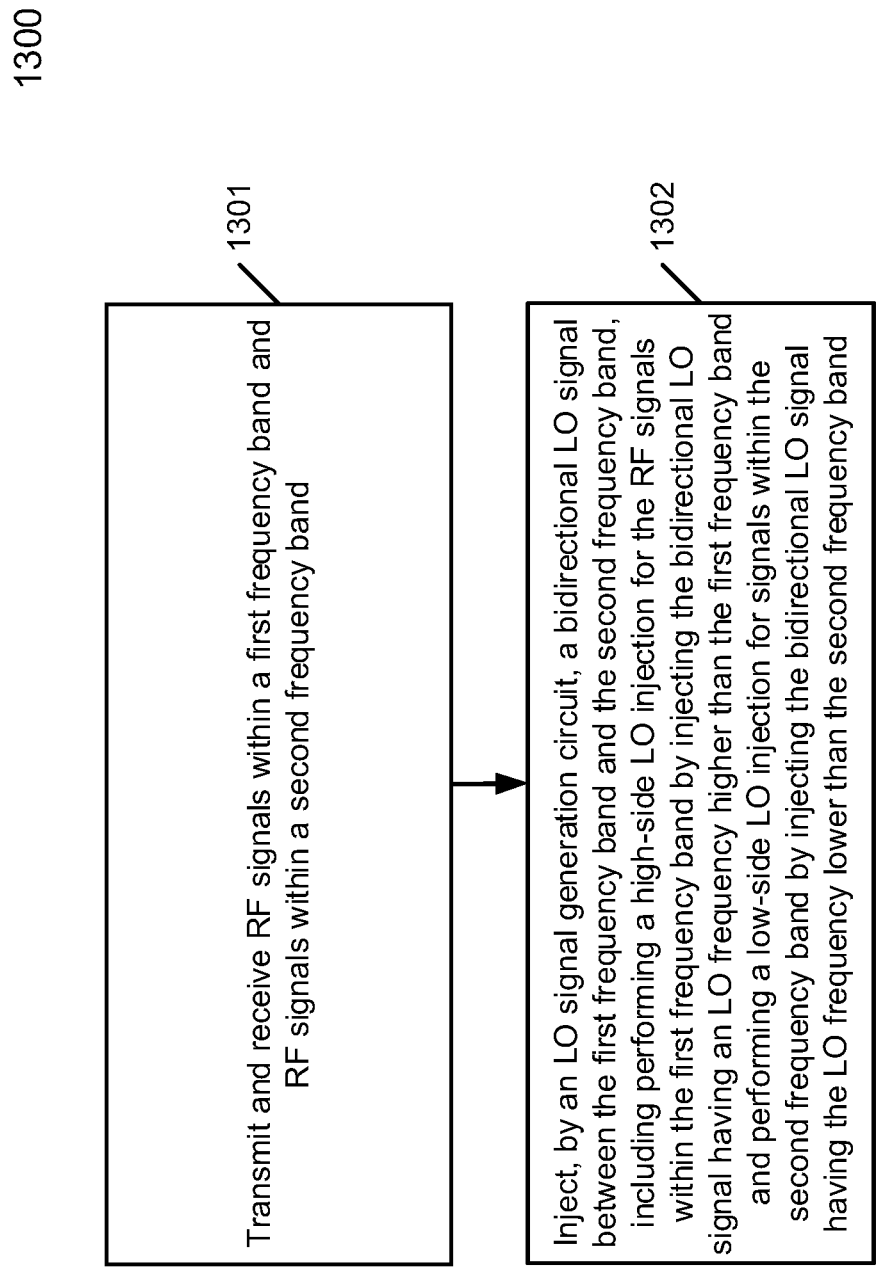
FIG. 13 is a flow diagram illustrating an example of a method of mm-Wave bidirectional signal-selection/image-rejection according to some embodiments of the disclosure.

FIG. 13 is a flow diagram 1300 illustrating an example of a method of mm-Wave bidirectional signal-selection/image-rejection according to some embodiments of the disclosure. By this method, a power consumption may be saved, a low phase noise may be achieved and a chip area may be reduced. Moreover, the method may be applied to 5G or even 6G-beyond MIMO/phased array communication systems with a low LO signal generation requirement.

At block 1301, RF signals within a first frequency band and RF signals within a second frequency band are transmitted and/or received.

At block 1302, an LO signal generation circuit may inject a bidirectional LO signal between the first frequency band and the second frequency band, a high-side LO injection for the RF signals within the first frequency band is performed by injecting the bidirectional LO signal having an LO frequency higher than the first frequency band and/or a low-side LO injection for signals within the second frequency band is performed by injecting the bidirectional LO signal having the LO frequency lower than the second frequency band.

In one embodiment, the bidirectional LO signal generation circuit includes a multiplier and an RF phased locked loop (PLL) circuit.

In one embodiment, the multiplier includes a tripler.

In one embodiment, the RF PLL circuit includes a phase-frequency detector (PFD), a charge pump, a loop filter, a voltage-controlled oscillator (VCO), and a programmable divider.

In one embodiment, the multiplier and the RF PLL circuit are the only one multiplier and only one RF PLL circuit for the high-side LO injection for the RF signals within the first frequency band and the low-side LO injection for the RF signals within the high frequency band.

In one embodiment, a wideband I/Q LO signal generation circuit coupled to the bidirectional LO signal generation circuit may generate wideband in-phase and quadrature (I/Q) LO RF signals. The I/Q LO RF signals may be up-converted by a TX up-conversion circuit coupled to the wideband I/Q LO generation circuit. The I/Q LO RF signals may be down-converted by a RX down-conversion circuit coupled to the wideband I/Q LO generation circuit.

In one embodiment, an image rejection may be determined by an Intermediate frequency (IF) Double Pole Double Throw (DPDT) circuit.

In one embodiment, the DPDT circuit operates at an IF frequency.

In one embodiment, the DPDT circuit has a through mode or a couple mode.

In one embodiment, the DPDT circuit operates at the through mode to keep an I/Q polarity of signals, and/or the DPDT circuit operates at the couple mode to change the I/Q polarity of signals.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A radio frequency (RF) frontend integrated circuit (IC) device, comprising:
   one or more RF transceivers to transmit and receive RF signals within a first frequency band and RF signals within a second frequency band that is higher than the first frequency band;
   a bidirectional local oscillator (LO) signal generation circuit coupled to the one or more transceivers to generate a bidirectional LO signal, wherein the bidirectional LO signal is injected between the first frequency band and the second frequency band, and wherein the bidirectional LO signal generation circuit is to perform a high-side LO injection for the RF signals within the first frequency band by injecting the bidirectional LO signal having an LO frequency higher than the first frequency band and to perform a low-side LO injection for the RF signals within the second frequency band by injecting the bidirectional LO signal having the LO frequency lower than the second frequency band;
   a multi-channel transmit (TX)/receive (RX) power splitting/combing circuit coupled to the one or more RF transceivers;
   a wideband in-phase and quadrature (I/Q) LO generation circuit coupled to the bidirectional LO signal generation circuit;
   a TX up-conversion circuit coupled to the wideband I/Q LO generation circuit; and
   a RX down-conversion circuit coupled to the wideband I/Q LO generation circuit.

2. The RF frontend IC device of claim 1, wherein the bidirectional LO signal generation circuit includes a multiplier and an RF phased locked loop (PLL) circuit.

3. The RF frontend IC device of claim 2, wherein the multiplier includes a tripler.

4. The RF frontend IC device of claim 2, wherein the RF PLL circuit includes a phase-frequency detector (PFD), a charge pump, a loop filter, a voltage-controlled oscillator (VCO), and a programmable divider.

5. The RF frontend IC device of claim 2, wherein the multiplier and the RF PLL circuit are the only one multiplier and only one RF PLL circuit for the high-side LO injection for the signals within the first frequency band and for the low-side LO injection for the signals within the second frequency band.

6. The RF frontend IC device of claim 1, further comprising an intermediate frequency (IF) Double Pole Double Throw (DPDT) circuit coupled with the TX up-conversion circuit or the RX down-conversion circuit, wherein the DPDT circuit is configured for correct image rejection.

7. The RF frontend IC device of claim 6, wherein the DPDT circuit operates at an IF frequency.

8. The RF frontend IC device of claim 6, wherein the DPDT circuit has a through mode and a couple mode.

9. The RF frontend IC device of claim 8, wherein the DPDT circuit keeps an I/Q polarity of signals in the through mode, and wherein the DPDT circuit changes the I/Q polarity of signals in the couple mode.

10. A method for communication by a radio frequency (RF) frontend integrated circuit (IC) device, comprising:
    transmitting and receiving RF signals within a first frequency band and RF signals within a second frequency band;
    injecting, by a bidirectional local oscillator (LO) signal generation circuit, a bidirectional LO signal between the first frequency band and the second frequency band, including performing a high-side LO injection for the RF signals within the first frequency band by injecting the bidirectional LO signal having an LO frequency higher than the first frequency band and performing a low-side LO injection for signals within the second frequency band by injecting the bidirectional LO signal having the LO frequency lower than the second frequency band;
    generating wideband in-phase and quadrature (I/Q) LO RF signals, by a wideband I/Q LO signal generation circuit coupled to the bidirectional LO signal generation circuit;
    up-converting the I/Q LO RF signals by a TX up-conversion circuit coupled to the wideband I/Q LO generation circuit; and
    down-converting the I/Q LO RF signals by a RX down-conversion circuit coupled to the wideband I/Q LO generation circuit.

11. The method of claim 10, wherein the bidirectional LO signal generation circuit includes a multiplier and an RF phased locked loop (PLL) circuit.

12. The method of claim 11, wherein the multiplier includes a tripler.

13. The method of claim 11, wherein the RF PLL circuit includes a phase-frequency detector (PFD), a charge pump, a loop filter, a voltage-controlled oscillator (VCO), and a programmable divider.

14. The method of claim 11, wherein the multiplier and the RF PLL circuit are the only one multiplier and only one RF PLL circuit for the high-side LO injection for the RF signals within the first frequency band and for the low-side LO injection for the RF signals within the second frequency band.

15. The method of claim 10, further comprising determining an image rejection by an Intermediate frequency (IF) Double Pole Double Throw (DPDT) circuit.

16. The method of claim 15, further comprising operating the DPDT circuit at an IF frequency.

17. The method of claim 15, further comprising operating the DPDT circuit at a through mode or a couple mode.

18. The method of claim 17, further comprising operating the DPDT circuit at the through mode to keep an I/Q polarity of signals, or operating the DPDT circuit at the couple mode to change the I/Q polarity of signals.

* * * * *